United States Patent [19]

Huang

[11] Patent Number: 6,058,151
[45] Date of Patent: May 2, 2000

[54] DIGITAL PHASE SHIFT PHASE-LOCKED LOOP FOR DATA AND CLOCK RECOVERY

[75] Inventor: Chen-Chih Huang, Hsinchu Hsien, Taiwan

[73] Assignee: Realtek Semiconductor Corp., Hsinchu, Taiwan

[21] Appl. No.: 08/914,168

[22] Filed: Aug. 19, 1997

[51] Int. Cl.[7] .................................................. H03D 3/24
[52] U.S. Cl. ..................... 375/376; 324/76.53; 455/260
[58] Field of Search ............................... 375/326, 327, 375/328, 371, 373, 374, 375, 376; 329/308; 331/1 A

[56] References Cited

U.S. PATENT DOCUMENTS

| | | | |
|---|---|---|---|
| 4,847,870 | 7/1989 | Butcher | 375/333 |
| 5,463,351 | 10/1995 | Marko et al. | 331/1 A |
| 5,479,458 | 12/1995 | Tanaka | 375/376 |
| 5,614,861 | 3/1997 | Harada | 329/308 |
| 5,633,899 | 5/1997 | Fiedler et al. | 375/376 |

*Primary Examiner*—Stephen Chin
*Assistant Examiner*—Thomas E McKiernan
*Attorney, Agent, or Firm*—Bacon & Thomas

[57] ABSTRACT

A phase-locked loop which is characterized by using two identical phase shifters and programmable UP/DN counters to generate a timing clock having accurate frequency. The clock which is used to recover the received data is made synchronous with the data by adjusting its phase without affecting its frequency. Therefore, frequency drift caused by data jitter of received data does not occur in the phase-locked loop according to the present invention. Besides, since the invention is an all-digital circuit, it is not sensitive to temperature change, voltage variation, or fabricating process fluctuation. Furthermore, it has excellent noise immunity.

8 Claims, 9 Drawing Sheets

FIG.8 PRIOR ART

DIGITAL PHASE SHIFT PHASE-LOCKED LOOP FOR DATA AND CLOCK RECOVERY

BACKGROUND OF THE INVENTION

1. Field of the Invention

The invention relates to a digital phase shift phase-locked loop for data and clock recovery.

2. Description of the Related Art

Figure 8:
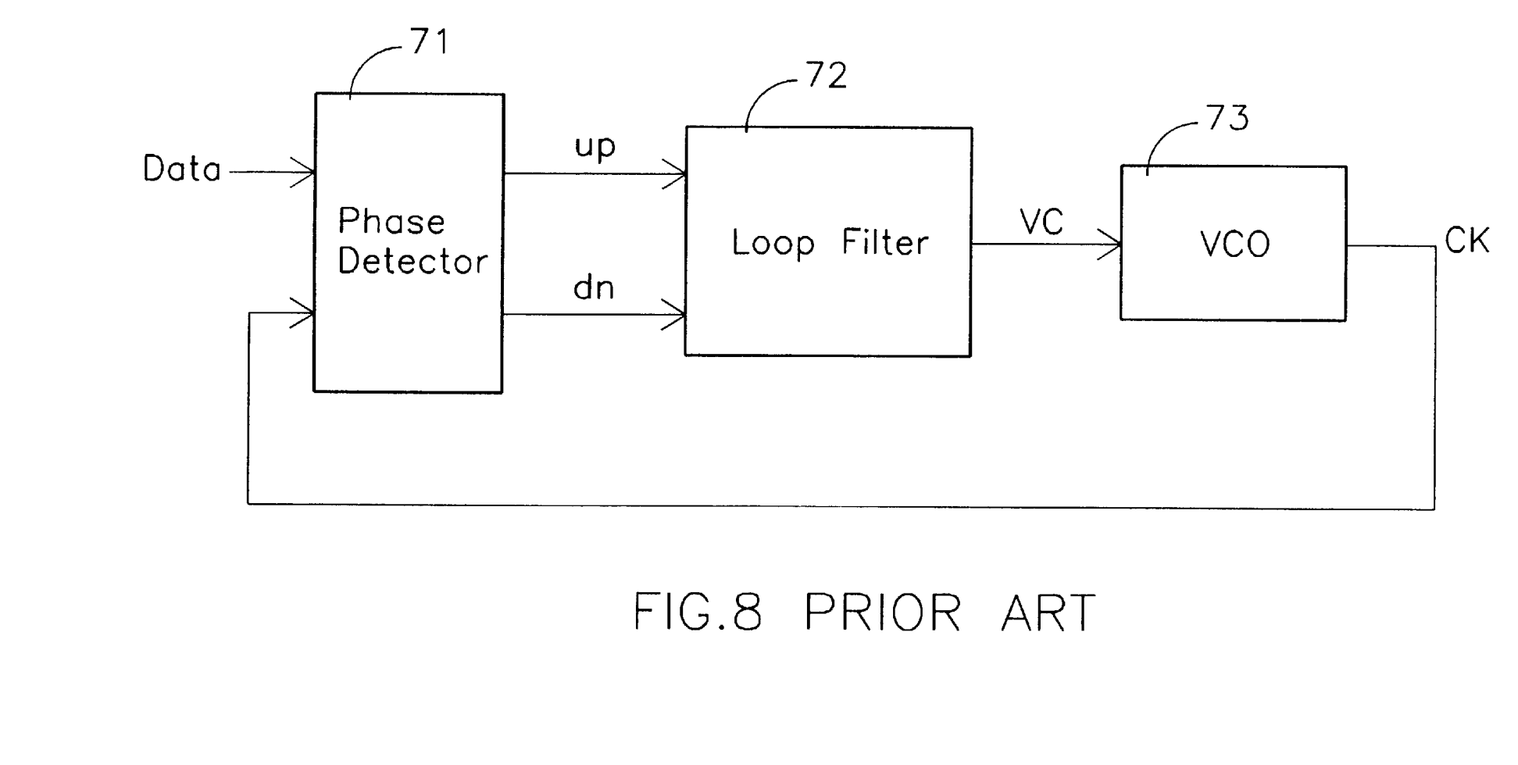
FIG. 8 shows a conventional phase-locked loop for data and clock recovery.

The phase-locked loop device is frequently used for the high-speed Ethernet application having a transmission rate up to 100 Mbps. A timing clock is generated by the voltage-controlled oscillator (VCO) of the phase-locked loop and is made synchronous with the received signal by a phase detector and a loop filter such that data recovery can be accomplished. FIG. 8 shows a conventional phase-locked loop which comprises a phase detector 71, a loop filter 72, and a voltage-controlled oscillator 73. The conventional phase-locked loop has the following disadvantages:

1. The input voltage of the voltage-controlled oscillator is continuously adjusted during the process of synchronizing the timing clock with the received data, which alters the frequency and phase of the output clock simultaneously. When the jitter of the received data results from transmission line decay is very severe, it may cause serious frequency drift which leads to erroneous result of data recovery, or what is worse, make the whole phase-locked loop out of locked range and synchronization thus becomes impossible.

2. The loop filter of a phase-locked loop is mainly composed of resistors and capacitors, while each of a resistor and a capacitor occupies a substantial area of the chip with the present integrated-circuiut fabrication technology.

Therefore, the primary object of the invention is to provide a phase shift phase-locked loop which synchronizes the output clock with the received data by adjusting the phase of the output clock without changing its frequency.

Another object of the invention is to provide a phase shift phase-locked loop whose corresponding integrated-circuit occupying a much smaller area than what prior phase-locked loops occupy.

SUMMARY OF THE INVENTION

Referring now to the block diagram shown in FIG. 1, the digital phase shift phase-locked loop according to the invention comprises a main loop 1 (below the dotted line) and a subsidiary loop 2 (above the dotted line). The main loop 1, which generates the clock signal CKr for recovering the received data, includes a phase shifter 11, a phase detector 12, and an UP/DN counter 13.

The phase shifter 11 receives a clock signal CK and a first control signal, outputs a clock signal CKr. The phase of the clock signal CKr lags behind the phase of the clock signal CK with a phase difference: k1+k2×(value of the first control signal), wherein k1 and k2 are two positive constants.

The phase detector 12 receives the clock signal CKr and a data signal Data, compares the phases of the two signals, and outputs the signals up and dn: (1) when the phase of CKr leads the phase of Data, up="1" and dn="0"; (2) when the phase of CKr lags behind the phase of Data, up="0" and dn="1"; (3) when the phases of CKr and Data are identical, up=dn="0".

The UP/DN counter 13 receives signals up and dn from the phase detector 12 and a wrap-around reference value N, wherein: (1) when up="1" and dn="0", the UP/DN counter 13 makes a Modulo N count up; (2) when up="0" and dn="1", the UP/DN counter 13 makes a Modulo N count down; (3) when up=dn="0", the count value of the UP/DN counter 13 keeps unchanged. The count value is sent to the phase shifter 11 as the control signal.

The subsidiary loop 2, which provides the aforesaid wrap-around reference value N to the main loop 1, includes a phase shifter 21, a phase detector 22 and an UP/DN counter 23.

The phase shifter 21 receives the clock signal CK and a second control signal, outputs a clock signal CKd. The phase of the clock signal CKd lags behind the phase of the clock signal CK with a phase difference: k1+k2×(value of the second control signal), wherein k1 and k2 are identical to the foregoing k1 and k2.

The phase detector 22 receives the clock signals CK and CKd, compares their phases with the first period of clock signal CK being ignored, the phase of clock signal CKd thus leading the phase of clock signal CK, wherein the output signals up and dn are: (1) when the phase of CKd leads the phase of CK, up="1" and dn="0"; (2) when the phase of CKd lags behind the phase of CKd, up="0" and dn="1"; (3) when the phases of CKd and CK are identical, up=dn="0".

The UP/DN counter 23 receives signals up and dn from the phase detector 22: (1) when up="1" and dn="0", the UP/DN counter 23 counts up; (2) when up="0" and dn="1", the UP/DN counter 23 counts down; (3) when up=dn="0", the count value of the UP/DN counter 23 keeps unchanged. The count value is sent to the phase shifter 21 as the aforesaid second control signal and the UP/DN counter 13 as the wrap-around reference value N as well.

For the phase detector 22, it outputs up="1" and dn="0" at the first clock period (since the first period of clock signal CK is ignored, it is considered that the phase of clock signal CK lags behind that of clock signal CKd), which makes the UP/DN counter 23 count up and consequently the phase of clock signal CKd lags further behind the phase of signal CK at the next clock period. Therefore, the phase detector 22 outputs up="1" and dn="0" again, the UP/DN counter 23 counts up again and the phase of signal CKd lags even further behind the phase of clock signal CK. Similar situation is repeated until the signal CKd lags behind the signal CK by exactly one period, at that time the phase detector 22 outputs up=dn="0", which makes the count value of UP/DN counter 23 remains unchanged subsequently. The subsidiary loop adjusts the wrap-around reference value N automatically even if phase difference between the clock signals CK and CKd is induced due to variation of surroundings (e.g. temperature). The signal CKr is used as the clock signal for recovering received data after the whole loop becomes stable.

DESCRIPTION OF THE PREFERRED EMBODIMENTS

Figure 1:
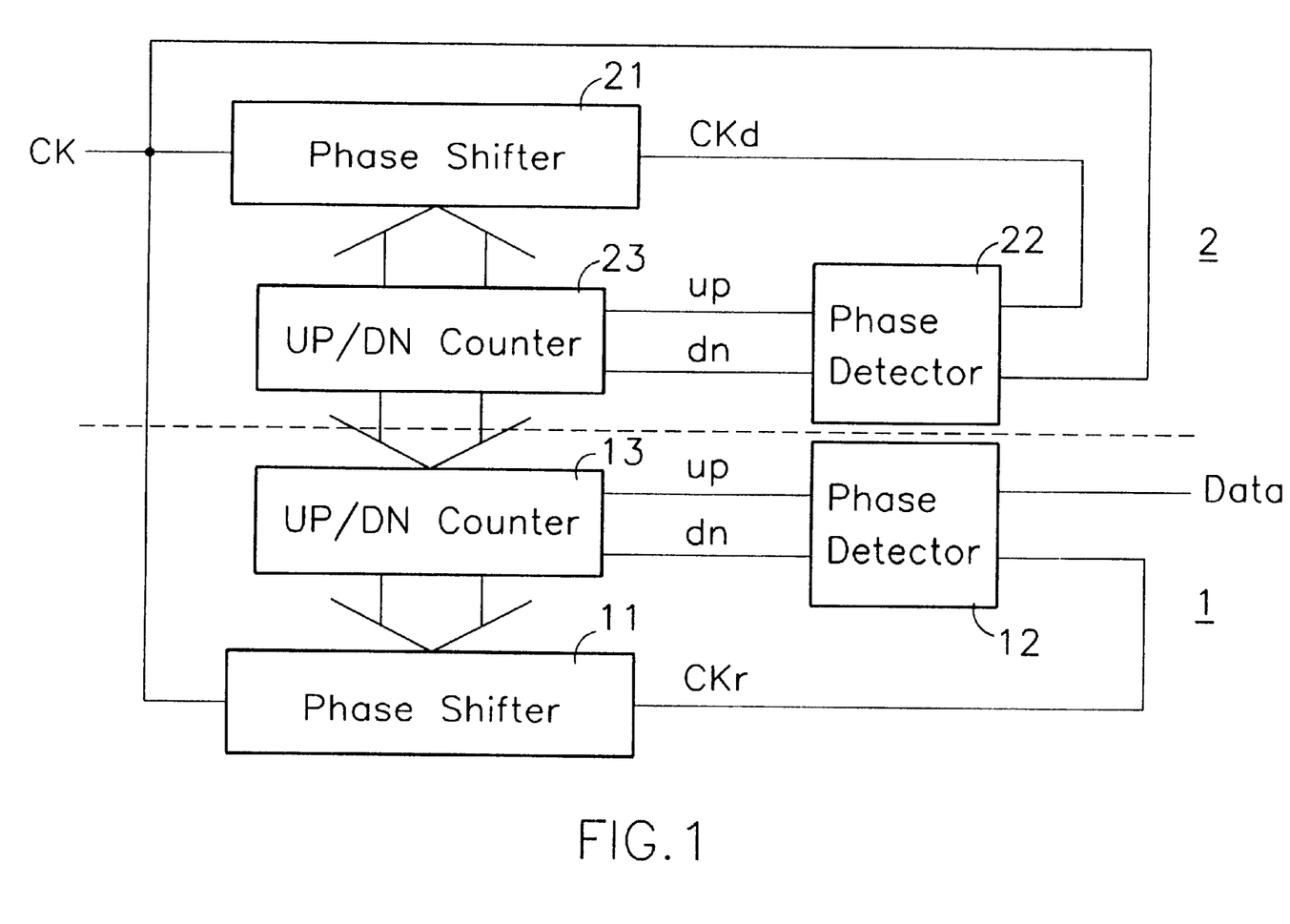
FIG. 1 is a block diagram showing the digital phase shift phase-locked loop for data and clock recovery according to the invention.
Figure 2:
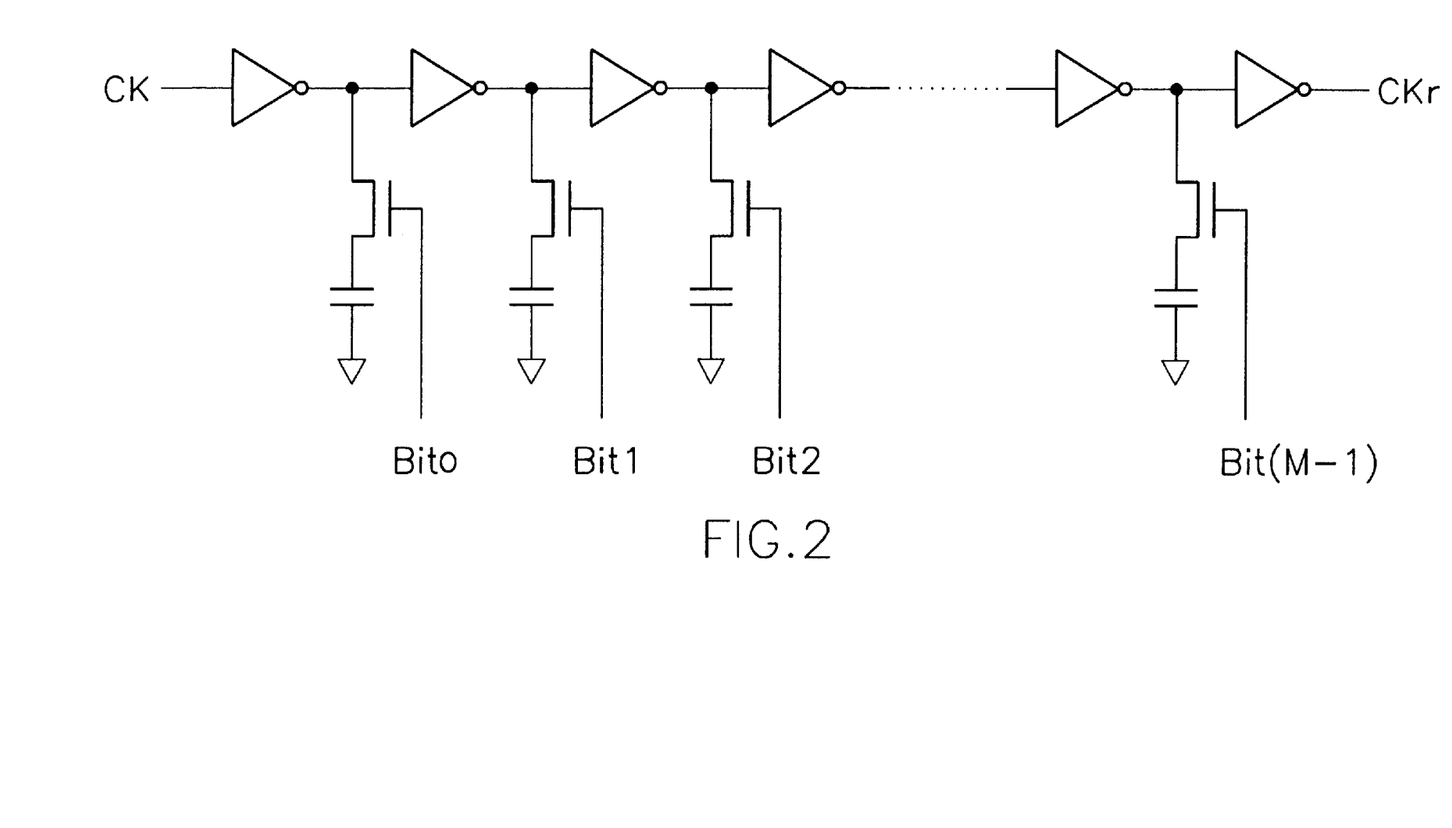
FIG. 2 shows the circuit diagram of a preferred embodiment of the phase shifter 11 shown in the block diagram of FIG. 1.

Referring to the circuit shown in FIG. 2, the phase shifter 11 consists of M stages of identical units (M≧N) in cascade connection, wherein each unit includes: an inverter, an NMOS transistor, and a capacitor. The inverter receives the output signal of the preceding unit and its output signal is used as the output signal of the unit; the drain and source of the NMOS transistor is connected between the output terminal of the inverter and the first terminal of the capacitor, while the second terminal of the capacitor is connected to ground. The gate of the NMOS transistor in each unit receives a different bit of the count value from the UP/DN counter 13 shown in FIG. 1, respectively. The first unit receives the clock signal CK as its input signal, the Mth unit outputs a signal as the clock signal CKr.

Figure 3:
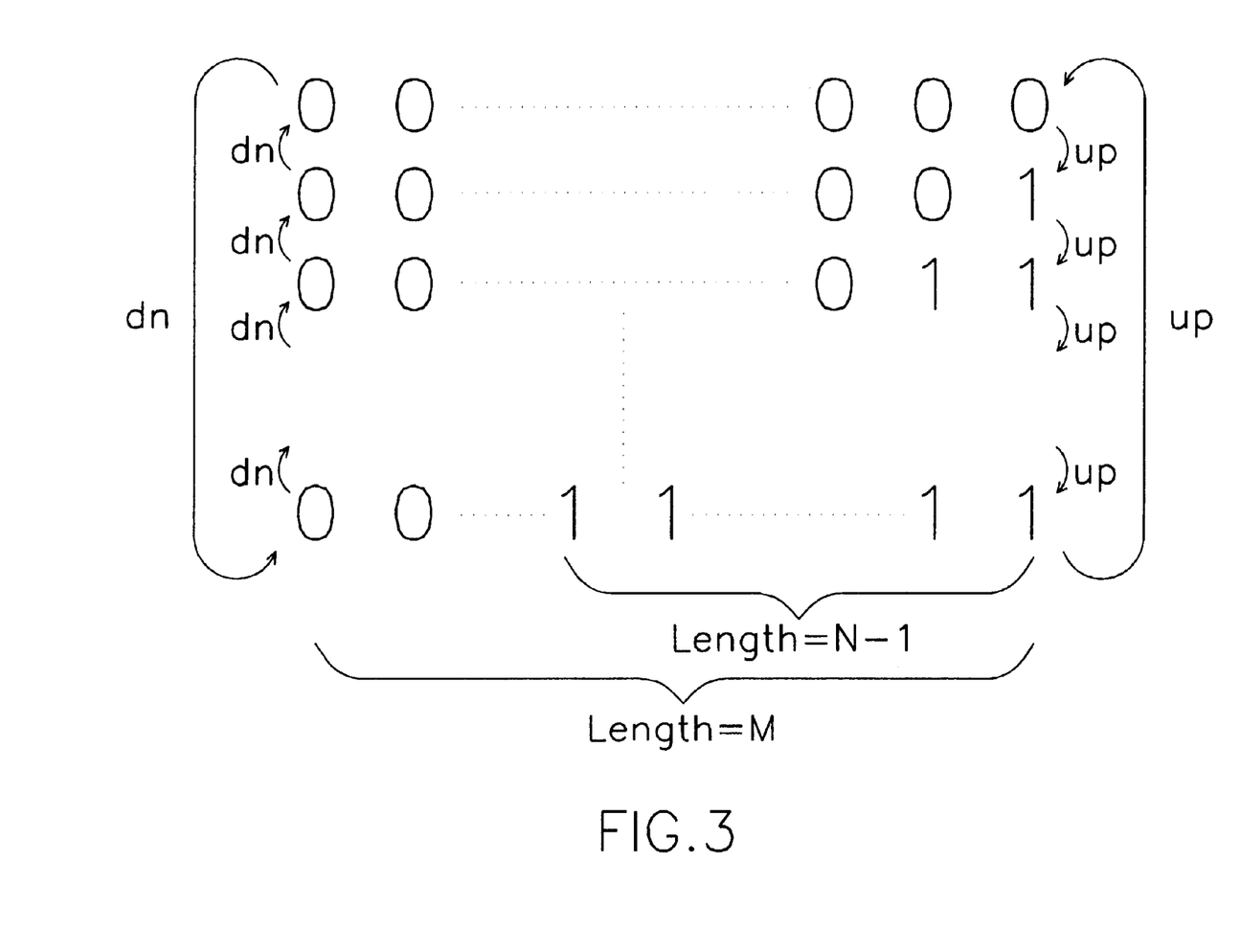
FIG. 3 shows the format of the count values of the UP/DN counter 13 which can be used in the circuit embodiment shown in FIG. 2.

The format of a count value of the UP/DN counter 13 is shown in FIG. 3, wherein each count value is a bit pattern with a length of M (M≧N). The count value can be illustrated as follows: 00 . . . 000⇋ 00 . . . 001⇋00 . . . 011⇋00 . . . 111⇋. . . ⇋0 . . . 01 . . . 11⇋00 . . . 000, wherein the rightward arrows mean counting up and the leftward arrows mean counting down, while the number of "1"s of the underlined count value is N-1. In other word, when the count value of UP/DN counter 13 reaches N-1 (the count value has N-1 "1"s) and is further counted up, it wraps around and becomes 0 (the count value does not have "1"). The process of counting down is similar.

The signal received by the NMOS of each stage of unit for the phase shifter shown in FIG. 2 is: the ith unit (1≦i≦M) receives the (i-1)th bit (1≦i≦M) of the count value from the UP/DN counter 13.

Referring to the description described in summary of the invention, the wrap-around reference value N means the count value of the UP/DN counter 23 when the phase of signal CKd lags behind the phase of the signal CK by 360°; this count value is sent to UP/DN counter 13 as its wrap-around reference value. Because of the variation of the surroundings (e.g. temperature), the N is not a fixed value. To solve the problem, the number of stages M of the phase shifter 11 is typically set to be somewhat larger than the N, then suppose that sorroundings factors make the count value of the UP/DN counter 23 which corresponds with the situation that the phase of clock signal CKd lags behind that of clock signal CK by 360° change, the subsidiary loop 2 can still figure out the precise count value. This explains why the value M must be large enough to adapt to maximum sorroundings factors fluctuation, in general, the value M is taken to be (4/3)*N, here the value N means the count value of the UP/DN counter 23 under normal condition.

The circuit of phase shifter 21 is identical to that of the phase shifter 11, and the circuit of UP/DN counter 23 is similar to that of the UP/DN counter 13 except that the UP/DN counter 13 receives a wrap-around reference value as an input signal, the phase difference between the clock signals CKr and CK is thus limited to within 360° according to the wrap-around reference value.

Figure 4:
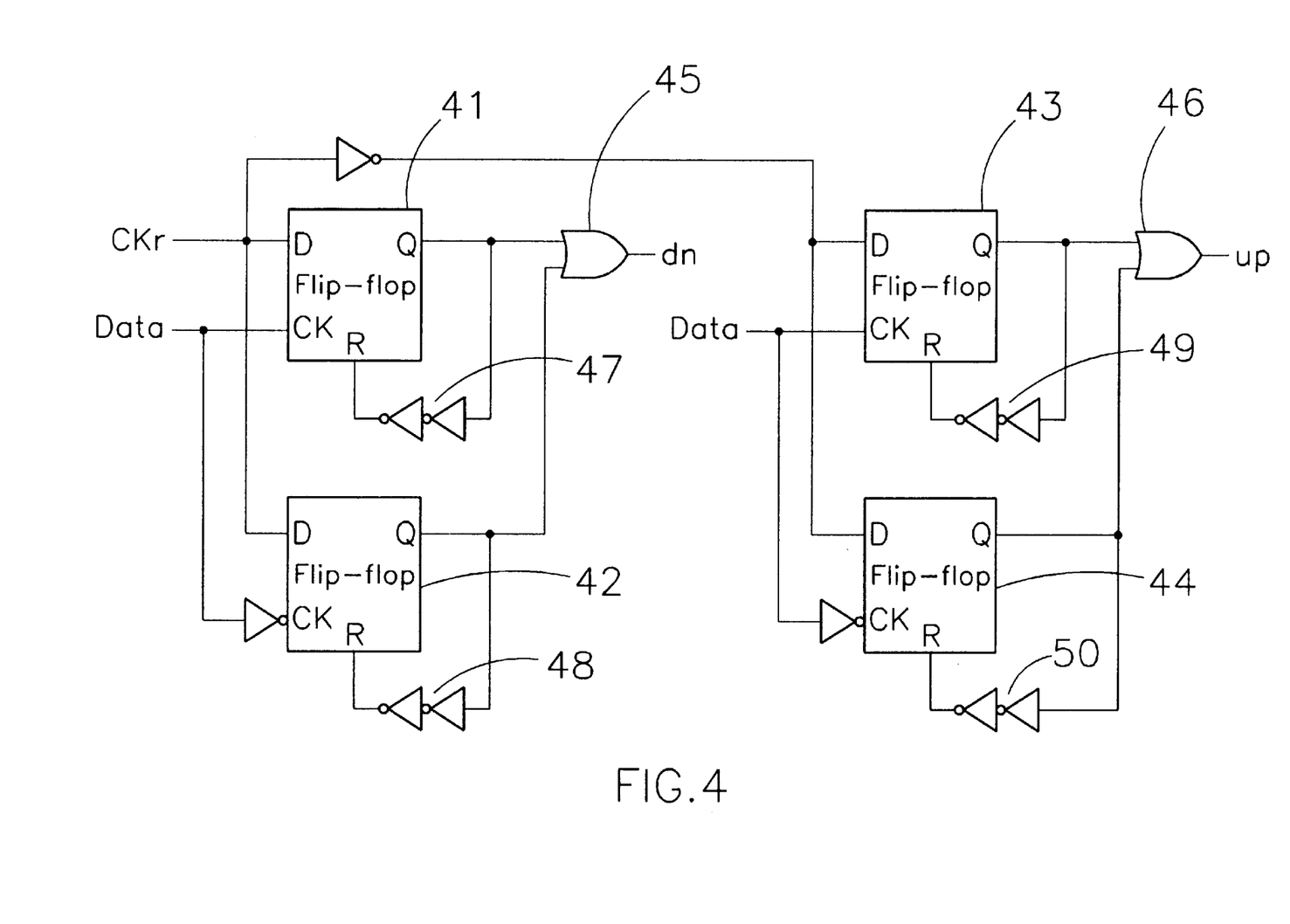
FIG. 4 shows the circuit diagram of a preferred embodiment of the phase detector 12 shown in the block diagram of FIG. 1.

Referring now to FIG. 4, the circuit of a preferred embodiment of the phase detector 12 comprises: four flip-flops 41~44, two OR gate 45, 46 both having two input terminals, some inverters, and some delay units.

The D terminal of the flip-flop 41 receives the clock signal CKr, the CK terminal receives data signal Data, the Q terminal is connected to the first input terminal of the OR gate 45 and connected to the R terminal of the flip-flop 41 through a delay unit 47.

The D terminal of the flip-flop 42 receives the clock signal CKr, the CK terminal receives the complement of data signal Data, the Q terminal is connected to the second input terminal of the OR gate 45 and connected to the R terminal of flip-flop 42 through a delay unit 48.

The D terminal of the flip-flop 43 receives the complement of clock signal CKr, the CK terminal receives data signal Data, the Q terminal is connected to the first input terminal of the OR gate 46 and connected to the R terminal of flip-flop 43 through a delay unit 49.

The D terminal of the flip-flop 44 receives the complement of clock signal CKr, the CK terminal receives the complement of data signal Data, the Q terminal is connected to the second input terminal of the OR gate 46 and connected to the R terminal of flip-flop 44 through a delay unit 50.

The output signal of OR gate 45 is used as signal dn and the output signal of OR gate 46 is used as signal up.

Figure 5A:
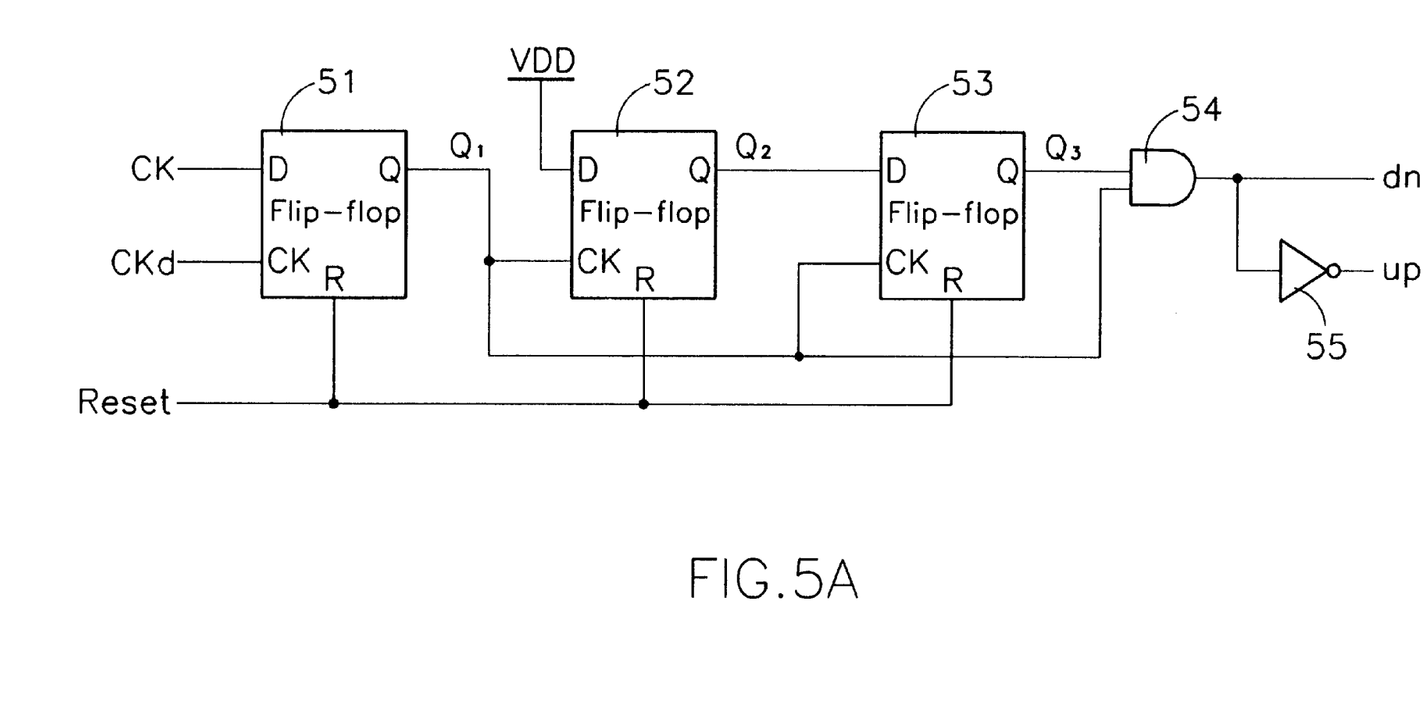
FIG. 5A shows the circuit diagram of a preferred embodiment of the phase detector 22 shown in the block diagram of FIG. 1.

Referring to FIG. 5A, the circuit of the preferred embodiment of phase detector 22 comprises: three flip-flops 51~53, an AND gate 54 having two input terminals, and an inverter 55.

The D terminal of flip-flop 51 receives the clock signal CK, the CK terminal receives the clock signal CKd, the Q terminal is connected to the CK terminals of flip-flops 52 and 53, and also connected to the first input terminal of the AND gate 54, the R terminal receives a clear signal Reset.

The D terminal of flip-flop 52 connects to the power supply VDD, the Q terminal is connected to the D terminal of flip-flop 53, the R terminal also receives the clear signal Reset.

The Q terminal of flip-flop 53 is connected to the second input terminal of AND gate 54 and the R terminal also receives the clear signal Reset.

The output signal of AND gate 54 is used as signal dn, while the complement of the output is used as signal up.

Figure 5B:
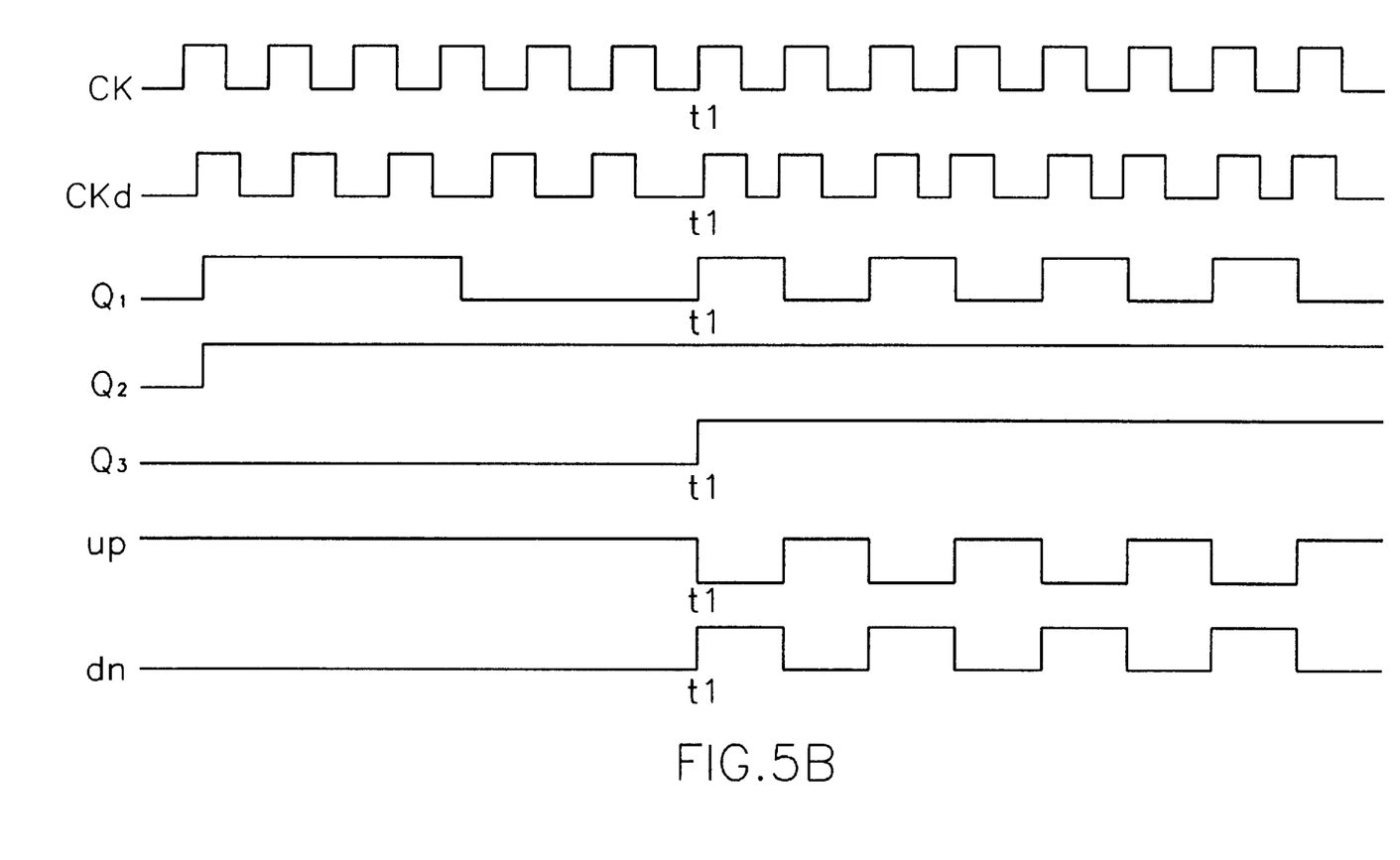
FIG. 5B shows the variations of the waveforms of different signals according to the circuit of FIG. 5A.

FIG. 5B shows the waveforms of the various signals in the circuit shown in FIG. 5A. It is to be noticed that the phase detector 22 continuously outputs up="1" and dn="0" before time $t_1$, which makes the count value of UP/DN counter 23 increase continuously and thus makes the phase of signal CKd lags further and further behind the phase of clock, signal CK owing to the phase shifter 21. Then when it comes to time $t_1$, the phase of signal CKd lags behind the phase of signal CK for more than 360° for the first time, at this moment, the phase detector 22 outputs up="0" and dn="1" for the first time, which advances the phase of the clock signal CKd at the next clock period. As a result, it turns out that the phase of clock signal CKd leads the phase of clock signal CK at the next period. The leading of the phase of signal CKd again makes the phase detector 22 output up="1" and dn="0" and then the phase of clock signal CKd lags behind the phase of signal CK again at the following period. According to the above explanation, it is apparent that the phase of clock signal CKd alternately leads and lags the phase of clock signal CK after time $t_1$ (referring to the waveforms shown in FIG. 5B). Therefore, the phase difference between clock signals CKd and signal CK does not exceed the phase delayed by one stage of delay unit, in other word, the phase difference is very small.

Figure 6:
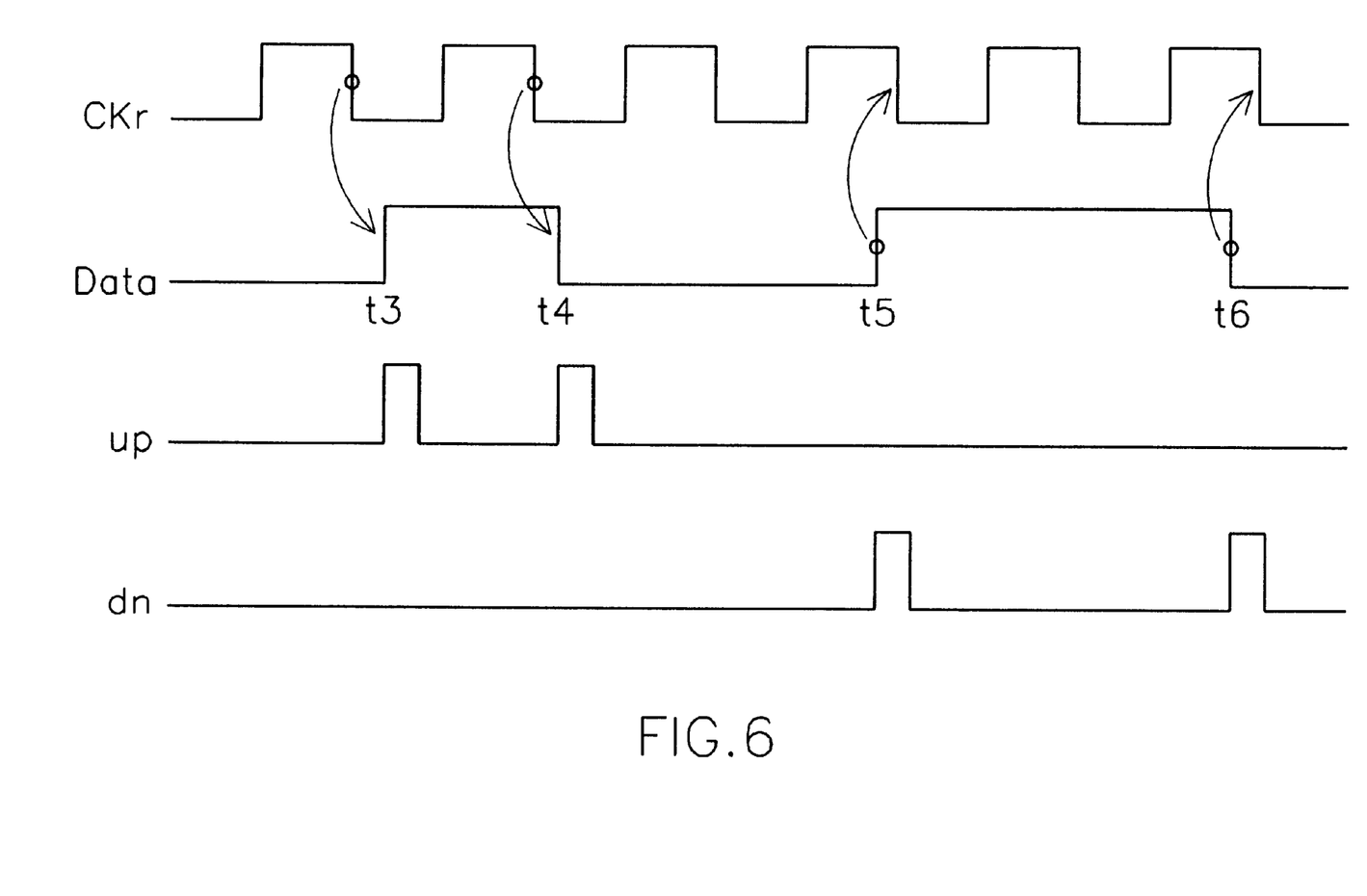
FIG. 6 shows how the clock signal CKr is made synchronous with the data signal Data by adjusting the phase of CKr using signals up and dn according to the block diagram shown in FIG. 1.

FIG. 6 shows how the phase of clock signal CKr can be adjusted according to the signals up and dn such that the signal CKr is made synchronous with the data signal Data. It is to be noticed that: (1) when it is time $t_3$ or $t_4$, the phase of clock signal CKr leads the phase of data signal Data, up="1" and dn="0" is generated in order to delay the phase of clock signal CKr at the next period, the phase difference between clock signals CKr and data signal Data is thus decreased; (2) when it is time $t_5$ or $t_6$, the phase of clock signal CKr lags behind the phase of data signal Data, up="0" and dn="1" is generated in order to advance the phase of clock signal CKr at the next period, the phase difference between clock signals CKr and data signal Data is thus decreased similarly.

Figure 7:
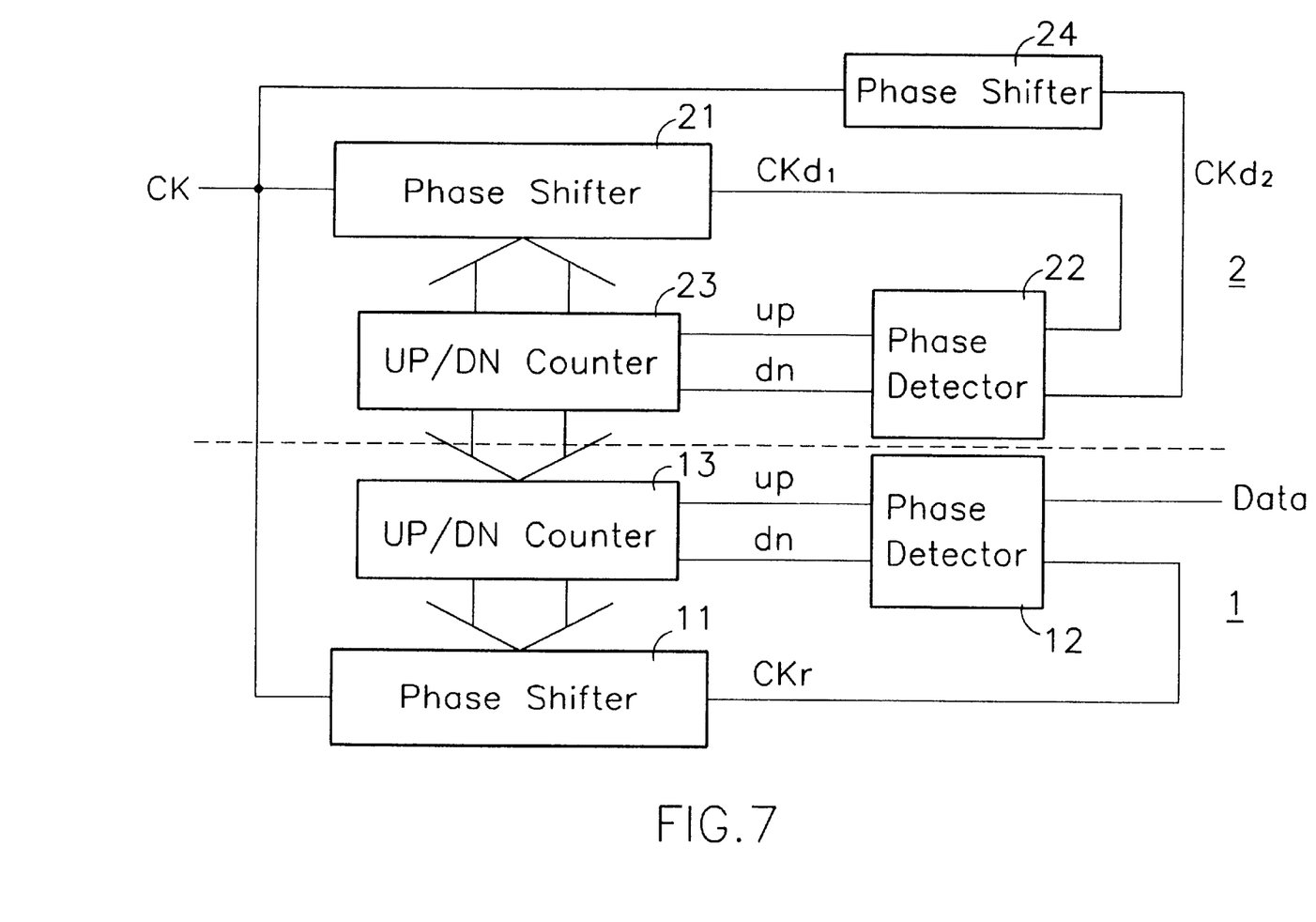
FIG. 7 shows the block diagram of the digital phase shift phase-locked loop for data and clock recovery according to another preferred embodiment of the invention.

Comparing the block diagram of another preferred embodiment shown in FIG. 7 with that shown in FIG. 1, the only difference is that the clock signal CK enters the phase detector 22 through the phase shifter 24. The phase shifter 24 has identical circuit configuration with the phase shifters 11 and 21, besides, its operating principle is very similar to the preferred embodiment shown in FIG. 1, the detailed description is thus omitted.

In summary, the phase-locked loop according to the present invention has the following advantages:

(1) The phase shifter changes the phase of the timing clock without affecting the frequency, frequency drift caused by the jitter of received data thus does not occur, which greatly reduces bit error rate.

(2) The invention is a digital circuit which is not affected by the temperature change, voltage variation, and fabricating parameters, and provides excellent immunity to noise.

(3) Although capacitor is needed for the phase shifter, since each capacitor provides only a very small phase delay, the capacitor occupies a very small area. The global phase-locked loop according to the present invention takes a smaller area as compared with the conventional phase-locked loop which includes a large-area loop filter.

(4) The additional subsidiary phase-locked loop keeps the phase delay not exceeding 360°, besides, the count value N corresponding to a phase difference of 360° is automatically adjusted, which reduces the error caused by the variation of the sorroundings factors.

The aforesaid embodiments are used only for illustrating but not limiting the invention. Variations and modifications can be made without departing from the spirit of the present invention. Therefore, the scope of the present invention is intended to cover the following appended claims.

What is claimed is:

1. A digital phase shift phase-locked loop, comprising:

a subsidiary phase detector for comparing the phases of a clock signal CK to a delayed clock signal CKd which is derived by delaying a predetermined phase of the clock signal CK, by first ignoring the first period of the clock signal CK, and allowing the phase of the delayed clock signal CKd to lead the phase of the clock signal CK, said subsidiary phase detector comprising:

a first flip-flop having a D terminal for receiving the clock signal CK, a CK terminal for receiving the delayed clock signal CKd, and a Q terminal;

a second flip-flop having a D terminal coupled to a high voltage VDD, a CK terminal connected to the Q terminal of said first flip-flop, and a Q terminal;

a third flip-flop having a CK terminal connected to the Q terminal of said first flip-flop, a D terminal connected to the Q terminal of said second flip-flop, and a Q terminal; and an AND gate having a first input terminal connected to the Q terminal of said first flip-flop, a second input terminal connected to the Q terminal of said third flip-flop, and an output terminal for generating a signal dn, and a complement of the signal dn as a signal up;

a subsidiary UP/DN counter connected to said subsidiary phase detector for receiving the signals up and dn, and for generating a count value as a wrap-around reference value N;

a subsidiary phase shifter for generating the delayed clock signal CKd in response to the clock signal CK and the wrap-around reference value N of said subsidiary UP/DN counter, the phase of the delayed clock signal CKD lagging behind the phase of the clock signal CK with a predetermined phase difference, said subsidiary phase shifter comprising a plurality of identical units in cascade connection, each of said identical units of the subsidiary phase shifter comprising:

an inverter, a capacitor, and an NMOS transistor;

a main phase detector for dynamically generating the signals up and dn in response to the comparison result of a recovered clock signal CKr and a data signal Data, said main phase detector comprising:

a first flip-flop having a D terminal for receiving the recovered clock signal CKr, a CK terminal for receiving the data signal Data, a Q terminal and an R terminal;

a second flip-flop having a D terminal for receiving the recovered clock signal CKr, a CK terminal for receiving the complement of the data signal Data, a Q terminal and an R terminal;

a first OR gate having a first input terminal connected to the Q terminal of said first flip-flop and to the R terminal of said first flip-flop via a delay unit, a second input terminal connected to the Q terminal of said second flip-flop, and to the R terminal of said second flip-flop via a delay unit, and an output terminal for generating the signal dn;

a third flip-flop having a D terminal for receiving the complement of the recovered clock signal CKr, a CK terminal for receiving the of the data signal Data, a Q terminal and an R terminal;

a fourth flip-flop having a D terminal for receiving the complement of the recovered clock signal CKr, a CK terminal for receiving the complement of the data signal Data, a Q terminal and an R terminal; and a second OR gate having a first input terminal connected to the Q terminal of said third flip-flop and to the R terminal of said third flip-flop via a delay unit, a second input terminal connected to the Q terminal of said fourth flip-flop and to the R terminal of said second flip-flop via a delay unit, and an output terminal for generating the signal up;

a main UP/DN counter for receiving the signals up and dn from said main phase detector and the wrap-around reference value N from said subsidiary UP/DN counter, and generating a count value as a control signal; and a main phase shifter for generating the recovered clock signal CKr in response to the clock signal CK and the control signal from said main UP/DN counter, the phase of the recovered clock signal CKr lagging behind the phase of the clock signal CK with a predetermined phase difference, said main phase shifter comprising a plurality of identical units in cascade connection, each of said identical units comprising:

an inverter, a capacitor, and an NMOS transistor.

2. The digital phase shift phase-locked loop as claimed in claim 1, wherein the predetermined phase difference of said subsidiary phase shifter is k1+k2 x, with k1 and k2 representing two positive constants, and x representing the control signal.

3. The digital phase shift phase-locked loop as claimed in claim 1, wherein the output signals up and dn of said subsidiary phase detector are determined as follows:

(1) when the phase of the delayed clock signal CKd leads the phase of the clock signal CK, up="1" and dn="0";

(2) when the phase of the delayed clock signal CKd lags behind the phase of the clock signal CK, up="0" and dn="1";

(3) when the phases of the delayed clock signal CKd and the clock signal CK are identical, up="0" and dn="0".

4. The digital phase shift phase-locked loop as claimed in claim 1, wherein said subsidiary UP/DN counter operates as follows:

(1) when up="1" and dn="0", said subsidiary UP/DN counter counts up;

(2) when up="0" and dn="1", said subsidiary UP/DN counter counts down;

(3) when up="0" and dn="0", the count value of said subsidiary UP/DN counter is unchanged.

5. The digital phase shift phase-locked loop as claimed in claim 1, wherein the predetermined phase difference is equal to k1+k2 x, with k1 and k2 representing two positive constants, and x representing the control signal.

6. The digital phase shift phase-locked loop as claimed in claim 1, wherein the output signals up and dn of said main phase detector are determined as follows:

(1) when the phase of the recovered clock signal CKr leads the phase of the signal Data, up="1" and dn="0";

(2) when the phase of the recovered clock signal CKr lags behind the phase of the signal Data, up="0" and dn="1";

(3) when the phases of the recovered clock signal CKd and the signal Data are identical, up="0" and dn="0".

7. The digital phase shift phase-locked loop as claimed in claim 1, wherein said main UP/DN counter operates as follows:

(1) when up="1" and dn="0", said main UP/DN counter carries out a Modulus N up-count;

(2) when up="0" and dn="1", said main UP/DN counter carries out a Modulus N down-count;

(3) when up="0" and dn="0", the count value of said main UP/DN counter is unchanged.

8. The digital phase shift phase-locked loop as claimed in claim 1, further comprising a second subsidiary phase detector for generating a second delayed clock signal CKd2 in response to the clock signal CK.

* * * * *